(12) United States Patent
Guo

(10) Patent No.: US 11,095,332 B2
(45) Date of Patent: Aug. 17, 2021

(54) SIGNAL AMPLIFIER OF MULTI-ANTENNA SYSTEM

(71) Applicant: SHENZHEN DACHI COMMUNICATION CO., LTD, Shenzhen (CN)

(72) Inventor: Yibing Guo, Shenzhen (CN)

(73) Assignee: SHENZHEN DACHI COMMUNICATION CO., LTD, Shenzhen (CN)

( * ) Notice: Subject to any disclaimer, the term of this patent is extended or adjusted under 35 U.S.C. 154(b) by 0 days.

(21) Appl. No.: 16/565,497

(22) Filed: Sep. 10, 2019

(65) Prior Publication Data

US 2020/0076465 A1 Mar. 5, 2020

Related U.S. Application Data

(63) Continuation of application No. PCT/CN2018/100349, filed on Aug. 14, 2018.

(30) Foreign Application Priority Data

Aug. 7, 2018 (CN) .......................... 201821263360.0

(51) Int. Cl.
*H04B 1/40* (2015.01)
*H01Q 5/50* (2015.01)
(Continued)

(52) U.S. Cl.
CPC .................. *H04B 1/40* (2013.01); *H01Q 1/50* (2013.01); *H01Q 5/50* (2015.01);
(Continued)

(58) Field of Classification Search
CPC ... H04B 1/40; H04B 3/58; H01Q 5/50; H01Q 21/0006; H01Q 1/50; H03F 3/19; H03F 2200/451
(Continued)

(56) References Cited

U.S. PATENT DOCUMENTS

| 10,075,779 B2 * | 9/2018 | Erreygers .............. H04B 10/25 |
| 2015/0036562 A1 | 2/2015 | Sturkovich et al. |

(Continued)

FOREIGN PATENT DOCUMENTS

| CN | 1909399 A | 2/2007 |
| CN | 101094032 A | 12/2007 |
| CN | 207442845 U | 6/2018 |

OTHER PUBLICATIONS

International Search Report for PCT/CN2018/100349.
Written Opinion of the International Search Authority for PCT/CN2018/100349.

*Primary Examiner* — Ayodeji O Ayotunde

(57) ABSTRACT

The present disclosure provides a signal amplifier of a multi-antenna system including an outdoor device communicating with base stations and an indoor device communicating with a client. The outdoor device includes a plurality of outdoor antennas, a first bidirectional signal amplifying link and a first combining-splitting network. A first end of the first bidirectional signal amplifying link is coupled to the outdoor antennas. A second end of the first bidirectional signal amplifying link is coupled to the first combining-splitting network. The indoor device includes an indoor antenna and a feeder. A first end of the feeder is coupled to the indoor antenna. A second end of the feeder is coupled to the first combining-splitting network through a radio frequency (RF) coaxial cable.

9 Claims, 4 Drawing Sheets

(51) Int. Cl.
  *H01Q 21/00* (2006.01)
  *H03F 3/19* (2006.01)
  *H01Q 1/50* (2006.01)

(52) U.S. Cl.
  CPC .......... *H01Q 21/0006* (2013.01); *H03F 3/19* (2013.01); *H03F 2200/451* (2013.01)

(58) Field of Classification Search
  USPC .................................................. 455/11.1, 73
  See application file for complete search history.

(56) References Cited

U.S. PATENT DOCUMENTS

2018/0077585 A1* 3/2018 Zhan .................. H04B 7/15528
2018/0151960 A1* 5/2018 Scheucher ......... H04B 7/15557

* cited by examiner

SIGNAL AMPLIFIER OF MULTI-ANTENNA SYSTEM

TECHNICAL FIELD

The present disclosure relates to a field of mobile communication technology, and in particular to a signal amplifier of a multi-antenna system.

BACKGROUND

A mobile phone signal amplifier (professional name: repeater) includes uplink amplifying links and downlink amplifying links. Each uplink amplifying link and each downlink amplifying link consist of antennas, a radio frequency (RF) duplexer, a low noise amplifier, a detector, an electric control attenuator, filters, power amplifiers, a center processing unit (CPU), and other components or modules. A working principle of the mobile phone signal amplifier is forward antennas (donor antennas) are configured to receive downlink signals of a base station into a booster, and signals are amplified by the low noise amplifier to prevent decrease of signalweak to noise ratio (S/N) caused by other components. The CPU controls attenuation of the electric control attenuator according to a signal strength detected by the detector, such that the signal strength reaches an appropriate level, and then amplified by the power amplifier, and transmitted by backward antennas (retransmission antennas) to a mobile station. Meanwhile, the backward antennas receive uplink signals of the mobile station, and transmit along a reverse path to processed by the uplink amplifying links. That is, the uplink signals pass through the low noise amplifier, the electronic control attenuator, the filter, and the power amplifier, and transmit to the base station, thereby realizing two-way communication between the base station and the mobile station.

In a conventional signal amplifier, full-frequency band antennas sacrifices some specifications of part of the frequency band to meet a requirements of a broadband. In addition, a number of ports that need to be combined is relatively large. A complex multiplex combining-splitting network generally consists of multiple stages of combiner and divider; however, losses are superimposed stage by stage, which greatly increases a downlink noise figure and a loss of uplink output power.

SUMMARY

The present disclosure provides a signal amplifier of a multi-antenna system to reduce a loss effectively.

To achieve the above object, the present disclosure provides a signal amplifier of a multi-antenna system. The signal amplifier of the multi-antenna system includes:

an outdoor device communicating with base stations; and
an indoor device communicating with a client.

The outdoor device includes a plurality of outdoor antennas, a first bidirectional signal amplifying link and a first combining-splitting network. A first end of the first bidirectional signal amplifying link is coupled to the outdoor antennas. A second end of the first bidirectional signal amplifying link is coupled to the first combining-splitting network. The indoor device includes an indoor antenna and a feeder. A first end of the feeder is coupled to the indoor antenna. A second end of the feeder is coupled to the first combining-splitting network through a radio frequency (RF) coaxial cable.

Optionally, the first bidirectional signal amplifying link includes a plurality of uplink amplifying links and downlink amplifying links. The uplink amplifying links and the downlink amplifying links are configured to process single frequency bands. The first combining-splitting network includes a high-frequency multiplex combining-splitting network, a low-frequency multiplex combining-splitting network and a high and low frequency combiner. First ends of the uplink amplifying links and first ends of the down amplifying links are coupled to the outdoor antennas through a first duplexer. Second ends of the uplink amplifying links and second ends of the downlink amplifying links are coupled to the high-frequency multiplex combining-splitting network or the low-frequency multiplex combining-splitting network. The high-frequency multiplex combining-splitting network and the low-frequency multiplex combining-splitting network are coupled to the indoor device through the high and low frequency combiner.

Optionally, the outdoor antennas include a plurality of single-frequency antennas receiving or sending single-frequency band signals. An output end of each uplink amplifying link of single frequency band and an input end of each downlink amplifying link of single frequency band are connected with one single-frequency antenna corresponding to the single frequency band after combined by the first duplexer.

Optionally, the outdoor antennas include a plurality of multi-frequency antennas receiving or sending multi-frequency band signals. Output ends of a plurality of the uplink amplifying links processing a single frequency band and input ends of a plurality of the downlink amplifying links are connected with one multi-frequency antenna after combined through matching with a combining network. The one multi-frequency antenna includes the single frequency bands.

Optionally, the multi-frequency band signals received or sent by the multi-frequency antennas are matched with frequency band signals of the base stations. The frequency band signals of the base stations are in a same direction of the multi-frequency antennas.

Optionally, the multi-frequency band signals received or sent by the multi-frequency antennas are matched with frequency band signals with minimum loss of the combining network after combining.

Optionally, the indoor device includes a second combining-splitting network and a second bidirectional signal amplifying link. Two ends of the second combining-splitting network are coupled to the feeder and the second bidirectional signal amplifying link respectively.

Optionally, the outdoor device includes a power supply unit and a power separation network. The indoor device includes a direct current power source. The feeder is connected with the power separation network through the RF coaxial cable. A positive pole and a negative pole of the direct current power source are fed into core wires and a shielding layer of the RF coaxial cable respectively through the feeder. And the positive pole and the negative pole of the direct current power source pass through the RF coaxial cable and are processed by the power separation network to supply to the power supply unit.

Optionally, the outdoor antennas include omnidirectional antennas and/or directional antennas.

Optionally, the outdoor device includes a shell. The plurality of the outdoor antennas are disposed in the shell. A distance between any two of the outdoor antennas is greater than 50 mm.

In the present disclosure, since an insertion loss of a long RF coaxial cable between the outdoor antennas and the amplifying links and an insertion loss of the multiplex combining-splitting network are optimized, a noise figure of the downlink amplifying links is greatly improved, and a receiving sensitivity of signals of the base stations is effectively improved. In a case that an output power of the uplink amplifying links is same as an output power of the conventional signal amplifier, a transmission distance of an amplified user terminal signal is increased by 2 to 4 times compared with a conventional signal amplifier. Moreover, when an original uplink transmission distance is guaranteed, a final stage amplifier of the uplink amplifying links adopts an amplifier with a smaller power capacity, and a power consumption is able to reduce by an order of magnitude, which reduce a purchase price of semiconductor amplifier components, and a heat dissipation structure is not needed to be mounted. Thus, a size of the shell of the present disclosure is reduced and a power adapter with a lower power is adopted, which greatly reduce a cost of the signal amplifier.

DETAILED DESCRIPTION

It should be understood in the description of the present disclosure that terms such as "central", "horizontal", "upper", "lower", "left", "right", "vertical", "horizontal", "top", "bottom", "inner", "outer", etc. indicate direction or position relationships shown based on the drawings, and are only intended to facilitate the description of the present disclosure and the simplification of the description rather than to indicate or imply that the indicated device or element must have a specific direction or constructed and operated in a specific direction, and therefore, shall not be understood as a limitation to the present disclosure. In addition, the terms such as "first" and "second" are only used for the purpose of description, rather than being understood to indicate or imply relative importance or hint the number of indicated technical features. Thus, the feature limited by "first" and "second" can explicitly or impliedly include one or more features.

In the description of the present disclosure, the meaning of "a plurality of" is two or more unless otherwise specified. In addition, the term "include" and any variant are intended to cover non-exclusive inclusion. It should be noted in the description of the present disclosure that, unless otherwise regulated and defined, terms such as "installation," "bonded," and "bonding" shall be understood in broad sense, and for example, may refer to fixed bonding or detachable bonding or integral bonding; may refer to mechanical bonding or electrical bonding; and may refer to direct bonding or indirect bonding through an intermediate medium or inner communication of two elements. For those of ordinary skill in the art, the meanings of the above terms in the present disclosure may be understood according to concrete conditions.

The present disclosure will be further described in detail below in combination with the drawings and preferred embodiments.

Embodiment 1

Figure 1:
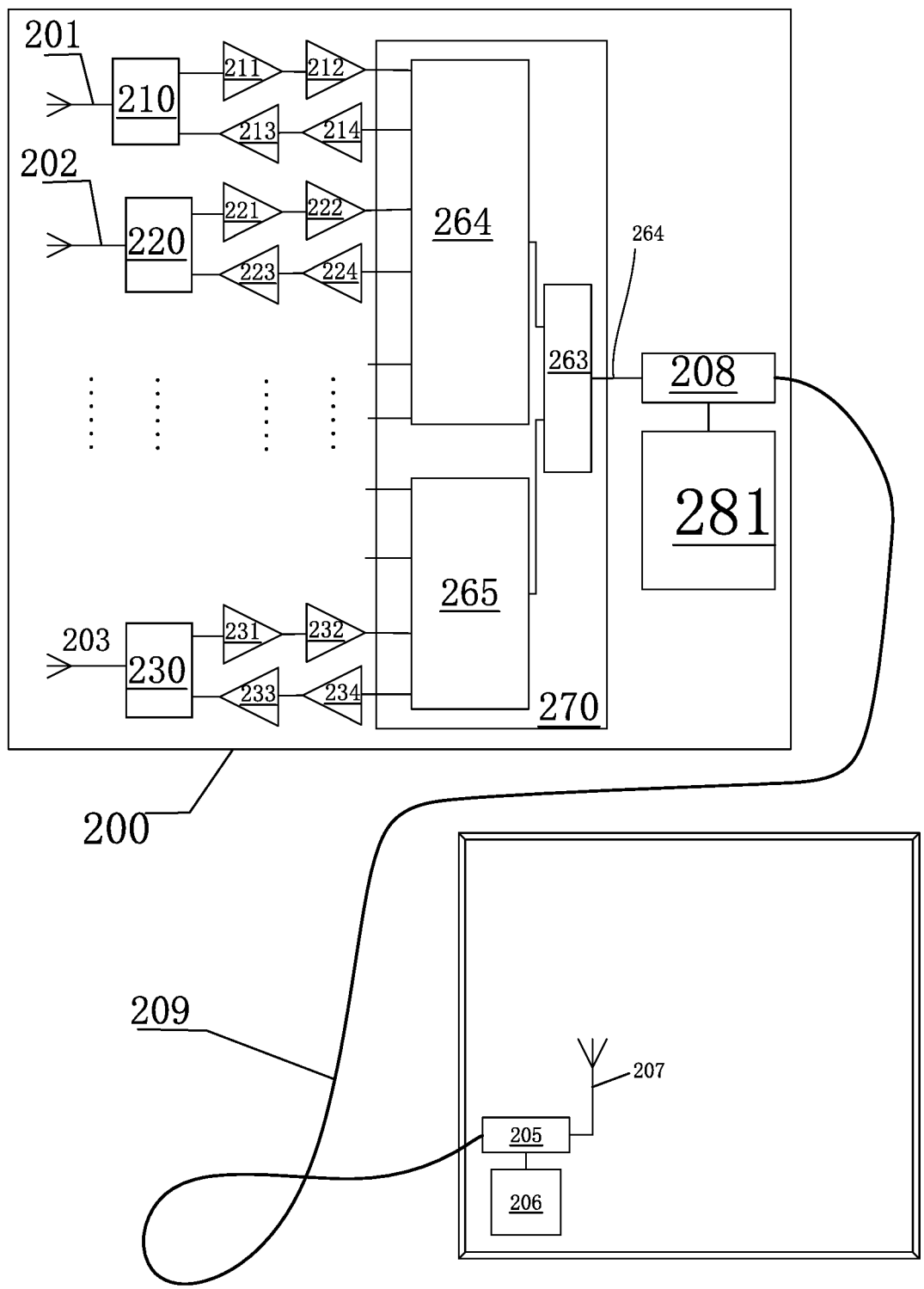
FIG. 1 is a schematic diagram showing a structure of a signal amplifier of a first embodiment of the present disclosure.

As shown in FIG. 1, the present disclosure provides a signal amplifier of a multi-antenna system. The signal amplifier of the multi-antenna system includes:

an outdoor device 200 communicating with base stations; and an indoor device communicating with a client.

The outdoor device 200 includes a plurality of outdoor antennas, a first bidirectional signal amplifying link, and a first combining-splitting network. A first end of the first bidirectional signal amplifying link is coupled to the outdoor antennas. A second end of the first bidirectional signal amplifying link is coupled to the first combining-splitting network. The indoor device includes an indoor antenna 207 and a feeder 205. A first end of the feeder 205 is coupled to the indoor antenna 207, and a second end of the feeder 205 is coupled to the first combining-splitting network through an RF coaxial cable 209.

Since the insertion loss of the long RF coaxial cable between the outdoor antennas and the amplifying links and the insertion loss of the multiplex combining-splitting network are optimized, a noise figure of the downlink amplifying links is greatly improved, and a receiving sensitivity of signals of the base stations is effectively improved. In a case that an output power of the uplink amplifying links is same as an output power of the conventional signal amplifier, a transmission distance of an amplified user terminal signal is increased by 2 to 4 times compared with the conventional signal amplifier. Further, in this embodiment, the signals are received by the outdoor antennas of the outdoor device, and the signals are directly processed by the first bidirectional signal amplifying link and the first combining-splitting network, and then the signals are amplified and transmitted to the indoor device through the RF coaxial cable 209, which effectively reduce the loss of the signals, and make the signals transmitted to the indoor device is more accurate and clear. Moreover, when a uplink transmission distance is guaranteed, a final stage amplifier of the uplink amplifying links adopts an amplifier with a smaller power capacity, and the power consumption is able to be reduced by an order of magnitude, which reduce a purchase price of semiconductor amplifier components, and a heat dissipation structure is not needed to be mounted. Thus, a size of a shell of the present disclosure is reduced and a power adapter with a lower power is adopted, which greatly reduce a cost of the signal amplifier.

Furthermore, the first bidirectional signal amplifying link includes a plurality of uplink amplifying links and downlink amplifying links. The uplink amplifying links and the downlink amplifying links are configured to process single frequency bands. The first combining-splitting network includes a high-frequency multiplex combining-splitting network, a low-frequency multiplex combining-splitting network and a high and low frequency combiner. First ends of the uplink amplifying links and first ends of the down amplifying links are coupled to the outdoor antennas through a first duplexer. Second ends of the uplink amplifying links and second ends of the downlink amplifying links are coupled to the high-frequency multiplex combining-splitting network or the low-frequency multiplex combining-splitting network. The high-frequency multiplex combining-splitting network and the low-frequency multiplex combining-splitting network are coupled to the indoor device 200 through the high and low frequency combiner.

Furthermore, the outdoor antennas include a plurality of single-frequency antennas receiving or sending single-frequency band signals. An output end of each uplink amplifying link of single frequency band and an input end of each downlink amplifying link of single frequency band are connected with one single-frequency antenna corresponding to the single frequency band after combined by the first duplexer. In the embodiment, the multiplex combining-splitting network connected with the ends of the outdoor antennas is simplified. The complex multi-port multiplex combining-splitting network is replaced by the first duplexer which is simple or a multi-port multiplex combining-splitting network with fewer ports, which reduce the insertion loss of the multiplex combining-splitting network. The insertion loss of the multiplex combining-splitting network is reduced from 4-10 dB to 1-3 dB, and the insertion loss of the long RF coaxial cable is cut out, thus, the signal amplifier is improved by 5-12 dB. Further, the improvement of an in-band flatness of the signal amplifier is also considerable.

Furthermore, the outdoor device 200 includes a power supply unit and a power separation network. The indoor device includes a direct current power source. The feeder 205 is connected with the power separation network through the RF coaxial cable. A positive pole and a negative pole of the direct current power source are fed into core wires and a shielding layer of the RF coaxial cable respectively through the feeder 205. And the positive pole and the negative pole of the direct current power source pass through the RF coaxial cable and are processed by the power separation network to supply to the power supply unit.

Furthermore, the bidirectional signal amplifying links of the signal amplifier are all disposed in the outdoor device 200, and a long RF coaxial cable is still needed to connect the indoor antenna 207 or a remaining part of the amplifying links in the room. The loss of the RF coaxial cable does not affect a downlink noise figure and an uplink output power. Although it affects an uplink noise figure and a downlink output power. However, the user using the mobile device are very close to the indoor antenna 207, generally, in a range of several tens of meters, the increased uplink noise figure and the attenuated downlink signal do not affect the user's use. Further, the RF coaxial cable that transmits the signals is configured to power the power supply unit of the outdoor device, thereby eliminating a need for a power wire for the power supply unit, making an installation of the signal amplifier easier and more aesthetically pleasing. Further, without affecting specifications of a system performance, the long RF coaxial cable connecting the indoor device and the outdoor device is able to be a thinner cable, which is beautiful and easy to install, and further reduces the cost.

Furthermore, the outdoor antennas include omnidirectional antennas and/or directional antennas. An original full-frequency band broadband antenna is replaced by narrow-band antennas corresponding to each frequency band, which reduces the design difficulty of the antennas. Since the signal amplifier is only for a relatively narrow frequency band, the specifications of the antennas are easier to implement and are more excellent than the full-frequency band antenna.

Furthermore, the outdoor device includes a shell. The plurality of the outdoor antennas are disposed in the shell. A distance between any two of the outdoor antennas is greater than 50 mm. A sufficient distance between the outdoor antennas is needed to reduce a mutual coupling between the outdoor antennas, thereby ensuring a transmission of the bidirectional signals with a lower loss.

To be specific, the bidirectional signal amplifying links of the signal amplifier are all disposed in the outdoor device 200, and the uplink amplifying links and the downlink amplifying links of each frequency band are separately connected to the corresponding outdoor antennas respectively. The embodiment is able to better adapt to the base stations disposed at any direction that provides service for a wireless device of the user.

The single-frequency antenna 201 is an omnidirectional antenna or directional antenna including a first frequency band. And the duplexer 210 is a duplexer of the first frequency band. The duplexer 210 includes a common port, a downlink frequency port, and an uplink frequency port. The common port of the duplexer 210 is connected with the single-frequency antenna 201, the downlink frequency port is connected with the input ends of the downlink amplifying links 211, 212, and the uplink frequency port is connected with the output ends of the uplink amplifying links 214, 213. Downlink amplifying links 211, 212 and uplink amplifying links 214, 213 include multiple stages of low noise amplifiers, filters, attenuators, detectors, power amplifiers, and other circuits the like.

The single-frequency antenna 202 is an omnidirectional antenna or directional antenna including a second frequency band. And the duplexer 220 is a duplexer of the second frequency band. The duplexer 220 includes a common port, a downlink frequency port, and an uplink frequency port. The common port of the duplexer 220 is connected with the single-frequency antenna 202, the downlink frequency port of the duplexer 220 is connected with the input ends of the downlink amplifying links 221, 222, and the uplink frequency port of the duplexer 220 is connected with the output ends of the uplink amplifying links 224, 223. Downlink amplifying links 221, 222 of the duplexer 220 and uplink amplifying links 224, 223 of the duplexer 220 include multiple stages of low noise amplifiers, filters, attenuators, detectors, power amplifiers, and other circuits the like.

The single-frequency antenna 203 is an omnidirectional antenna or directional antenna including a Nth frequency band. And the duplexer 230 is a duplexer of the Nth frequency band. The duplexer 230 includes a common port, a downlink frequency port, and an uplink frequency port. The common port of the duplexer 230 is connected with the single-frequency antenna 203, the downlink frequency port of the duplexer 230 is connected with the input ends of the downlink amplifying links 231, 232, and the uplink frequency port of the duplexer 230 is connected with the output ends of the uplink amplifying links 234, 233. Downlink amplifying links 231, 232 of the duplexer 230 and uplink amplifying links 234, 233 of the duplexer 220 include multiple stages of low noise amplifiers, filters, attenuators, detectors, power amplifiers, and other circuits the like.

The output ends of the downlink amplifying links of the first frequency band and the input ends of the uplink amplifying links of the first frequency band, the output ends of the downlink amplifying links of the second frequency band and the input ends of the uplink amplifying links of the second frequency band, and the output ends of the downlink amplifying links of other frequency bands and the input ends of the uplink amplifying links of the other frequency bands are connect with the low-frequency multiplex combining-splitting network 264 separately to be combined together, and then connected with an low-frequency end of the high and low frequency combiner 263. A high-frequency end of the high and low frequency combiner 263 is connected with a common end of the high-frequency multiplex combining-splitting network 265 after combining. The high and low frequency combiner 263 is configured to connect all the uplink inputs and downlink inputs of all the frequency bands to the common end 264, and then passes through the DC power separation network 280, and finally connect with the feeder 205 and the indoor antenna 207 through the RF coaxial cable 209.

The function of the power separation network 280 is to separate a DC power supply voltage between the shielding layer and core wires of the RF coaxial cable from the uplink RF signals and downlink RF signals of the RF coaxial cable. And the DC power supply voltage is supplied to the power supply unit 281 of the outdoor device, and then supplied to each active circuit after the voltage is stable. At the same time, the bidirectional RF signals are transmitted between the RF coaxial cable 209 and the high and low frequency combiner 263 with as little loss as possible.

A working principle of the feeder 205 is same as a working principle of the power separation network 280. The feeder 205 is configured to feed the DC power output from an AC/DC power adapter 206 into the RF coaxial cable 209 to supply the outdoor device, which has minimal attenuation of the RF signals between the RF coaxial cable 209 and the indoor antenna 207.

In the embodiment, the single-frequency antennas 201, 202, and 203 are outdoor antennas including only one single frequency band. If the directional antennas are used, the outdoor antennas of each frequency band are aligned with directions of the operator's base stations, regardless of the direction in which the operator's base stations are. It would not happen that several frequency bands share one antenna and affects the sensitivity of the signals in different directions. Further, the high-gain directional antennas further improve a communication distance and a communication quality.

Optionally, the single-frequency antennas 201, 202, and 203 are omnidirectional antennas. Since each single-frequency antenna only includes one single frequency band, and a bandwidth is small relative to the full-frequency band antenna. Thus, the omnidirectional antennas with small-sized single frequency and a simple structure are able to achieve a same performance index of the omnidirectional antennas with full-frequency band, such that the single-frequency antennas 201, 202, and 203 are disposed in the same shell. The appearance of the signal amplifier is more compact, the direction of each single-frequency antenna does not need to be adjusted, and the signal amplifier is suitable for a case that the direction of the base stations around the user cannot be determined. In the shell, a sufficient distance between the antennas is needed to reduce the mutual coupling between the antennas. A size of the shell should satisfy that the minimum distance between any two antennas in the shell is not less than 50-100 mm.

Optionally, other components of the outdoor device 200 are in the same shell as the outdoor antennas, or in a separate shell placed near the shell having the outdoor antennas. The single-frequency antenna of each frequency band is directly connected with the corresponding uplink and downlink amplifying links, or the single-frequency antenna of each frequency band is connected with the corresponding uplink and downlink amplifying links through a short cable.

Embodiment 2

Figure 2:
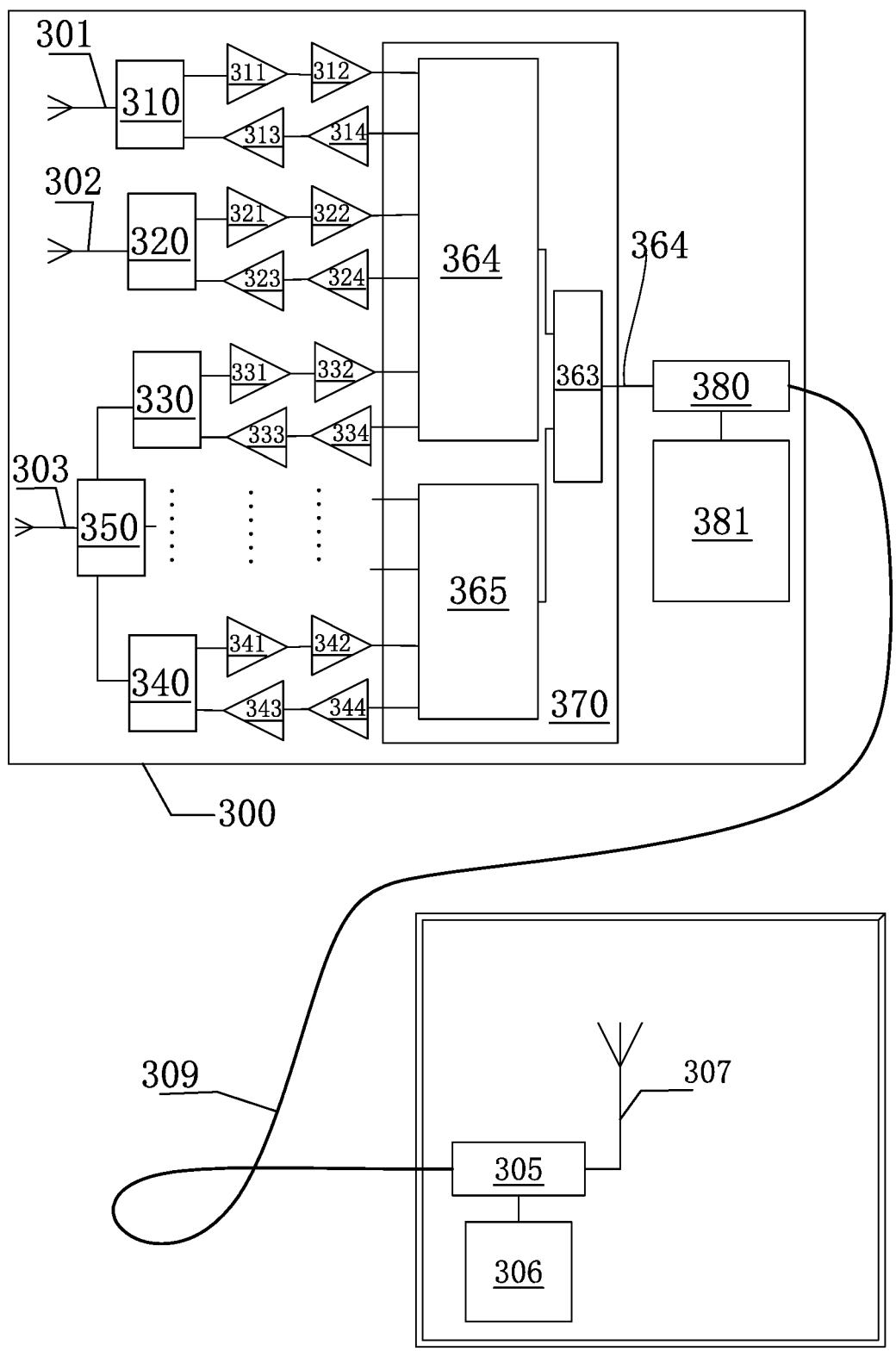
FIG. 2 is a schematic diagram showing a structure of a signal amplifier of a second embodiment of the present disclosure.

As shown in FIG. 2, the present disclosure provides a signal amplifier of a multi-antenna system. The signal amplifier of the multi-antenna system includes:

an outdoor device communicating with base stations; and an indoor device 300 communicating with a client.

The outdoor device includes a plurality of outdoor antennas, a first bidirectional signal amplifying link and a first combining-splitting network. A first end of the first bidirectional signal amplifying link is coupled to the outdoor antennas. A second end of the first bidirectional signal amplifying link is coupled to the first combining-splitting network. The indoor device 300 includes an indoor antenna 307 and a feeder 305. A first end of the feeder 305 is coupled to the indoor antenna 307. A second end of the feeder 305 is coupled to the first combining-splitting network through an RF coaxial cable 309.

Since the insertion loss of the long RF coaxial cable between the outdoor antennas and the amplifying links and the insertion loss of the multiplex combining-splitting network are optimized, the noise figure of the downlink amplifying links is greatly improved, and the receiving sensitivity of signals of the base station is effectively improved. In the case that an output power of the uplink amplifying links is same as an output power of the conventional signal amplifier, the transmission distance of the amplified user terminal signal is increased by 2 to 4 times compared with the conventional signal amplifier. Further, in this embodiment, the signals are received by the outdoor antennas of the outdoor device, and the signals are directly processed by the first bidirectional signal amplifying link and the first combining-splitting network, and then the signals are amplified and transmitted to the indoor device through the RF coaxial cable 309, which effectively reduce the loss of the signals, and make the signals transmitted to the indoor device is more accurate and clear. Moreover, when the uplink transmission distance is guaranteed, the final stage amplifier of the uplink amplifying links adopts an amplifier with the smaller power capacity, and the power consumption is able to be reduced by an order of magnitude, which reduce the purchase price of semiconductor amplifier components, and the heat dissipation structure is not needed to be mounted. Thus, the size of the shell of the present disclosure is reduced and the power adapter with the lower power is adopted, which greatly reduce the cost of the signal amplifier.

Furthermore, the first bidirectional signal amplifying link includes a plurality of uplink amplifying links and downlink amplifying links. The uplink amplifying links and the downlink amplifying links are configured to process single frequency bands. The first combining-splitting network includes a high-frequency multiplex combining-splitting network, a low-frequency multiplex combining-splitting network and a high and low frequency combiner. First ends of the uplink amplifying links and first ends of the down amplifying links are coupled to the outdoor antennas through a first duplexer. Second ends of the uplink amplifying links and second ends of the downlink amplifying links are coupled to the high-frequency multiplex combining-splitting network or the low-frequency multiplex combining-splitting network. The high-frequency multiplex combining-splitting network and the low-frequency multiplex combining-splitting network are coupled to the indoor device 300 through the high and low frequency combiner.

Furthermore, the outdoor antennas include a plurality of single-frequency antennas receiving or sending single-frequency band signals. An output end of each uplink amplifying link of single frequency band and an input end of each downlink amplifying link of single frequency band are connected with one single-frequency antenna corresponding to the single frequency band after combined by the first duplexer.

Furthermore, the outdoor antennas include a plurality of multi-frequency antennas receiving or sending multi-frequency band signals. Output ends of a plurality of the uplink amplifying links processing a single frequency band and input ends of a plurality of the downlink amplifying links are connected with one multi-frequency antenna after combined through matching with a combining network. The one multi-frequency antenna includes the single frequency bands.

By reasonably optimizing the number of frequency bands of the outdoor antennas and adopting a setting method of dividing the frequency bans with multiple antennas, a problem of poor performance of the wide frequency band is effectively solved, and the signal reception is more accurate and clear. Moreover, the multiplex combining-splitting network connected with the ends of the outdoor antennas is simplified. The complex multi-port multiplex combining-splitting network is replaced by the first duplexer which is simple or a multi-port multiplex combining-splitting network with fewer ports, which reduce the insertion loss of the multiplex combining-splitting network. The insertion loss of the multiplex combining-splitting network is reduced from 4-10 dB to 1-3 dB, and the insertion loss of the long cable is cut out, thus, the signal amplifier is improved by 5-12 dB. Further, the improvement of an in-band flatness of the signal amplifier is also considerable.

Furthermore, the outdoor device includes a power supply unit and a power separation network. The indoor device 300 includes a direct current power source. The feeder 305 is connected with the power separation network through the RF coaxial cable. A positive pole and a negative pole of the direct current power source are fed into core wires and a shielding layer of the RF coaxial cable respectively through the feeder 305. And the positive pole and the negative pole of the direct current power source pass through the RF coaxial cable and are processed by the power separation network to supply to the power supply unit. The bidirectional signal amplifying links of the signal amplifier are all disposed in the outdoor device, and a long RF coaxial cable is still needed to connect the indoor antenna 307 or a remaining part of the amplifying links of the room. The loss of the RF coaxial cable does not affect a downlink noise figure and an uplink output power. Although it affects an uplink noise figure and a downlink output power, however, the user using the mobile devices are very close to the indoor antenna 307, generally, in a range of several tens of meters, the increased uplink noise figure and the attenuated downlink signal do not affect the user's use. Further, the RF coaxial cable that transmits the signals is configured to power the power supply unit of the outdoor device, thereby eliminating a need for a power wire for the power supply unit, making an installation of the signal amplifier easier and more aesthetically pleasing. Further, without affecting specifications of a system performance, the long RF coaxial cable connecting the indoor device and the outdoor device is able to be a thinner cable, which is beautiful and easy to install, and further reduces the cost.

Furthermore, the outdoor antennas include omnidirectional antennas and/or directional antennas. An original full-frequency band broadband antenna is replaced by narrow-band antennas corresponding to each frequency band, which reduces the design difficulty of the antennas. Since the signal amplifier is only for a relatively narrow frequency band, the specifications of the antennas are easier to implement and are more excellent than the full-frequency band antenna.

Furthermore, the outdoor device includes a shell. The plurality of the outdoor antennas are disposed in the shell. A distance between any two of the outdoor antennas is greater than 50 mm. A sufficient distance between the outdoor antennas is needed to reduce a mutual coupling between the outdoor antennas, thereby ensuring a transmission of the bidirectional signals with a lower loss.

To be specific, the bidirectional signal amplifying links of the signal amplifier are all disposed in the outdoor device. The uplink amplifying links and the downlink amplifying links of some frequency bands are separately connected to the corresponding outdoor antennas respectively. The uplink amplifying links and the downlink amplifying links of other frequency bands are connected with outdoor antennas containing these frequency bands by the simple multiplex combining-splitting network. The embodiment is able to better adapt to the base stations of the some frequency bands disposed at the same direction, or when the number of the frequency bands is large, an installation conditions cannot satisfy a case that one single antenna corresponds to one frequency band.

The single-frequency antenna 301 is an omnidirectional antenna or directional antenna including a first frequency band. And the duplexer 310 is a duplexer of the first frequency band. The duplexer 310 includes a common port, a downlink frequency port, and an uplink frequency port. The common port of the duplexer 310 is connected with the single-frequency antenna 301, the downlink frequency port is connected with the input ends of the downlink amplifying links 311, 312, and the uplink frequency port is connected with the output ends of the uplink amplifying links 314, 313. Downlink amplifying links 311, 312 and uplink amplifying links 314, 313 include multiple stages of low noise amplifiers, filters, attenuators, detectors, power amplifiers, and other circuits the like.

The single-frequency antenna 302 is an omnidirectional antenna or directional antenna including a second frequency band. And the duplexer 320 is a duplexer of the second frequency band. The duplexer 320 includes a common port, a downlink frequency port, and an uplink frequency port. The common port of the duplexer 320 is connected with the single-frequency antenna 302, the downlink frequency port of the duplexer 320 is connected with the input ends of the downlink amplifying links 321, 322, and the uplink frequency port of the duplexer 320 is connected with the output ends of the uplink amplifying links 324, 323. Downlink amplifying links 321, 322 of the duplexer 220 and uplink amplifying links 324, 323 of the duplexer 320 include multiple stages of low noise amplifiers, filters, attenuators, detectors, power amplifiers, and other circuits the like.

The multi-frequency antenna 303 is an omnidirectional antenna or directional antenna including multiple frequency bands. And the duplexer 330 is a duplexer of one frequency band of the multiple frequency bands. The duplexer 330 includes a common port, a downlink frequency port, and an uplink frequency port. The common port of the duplexer 330 is connected with a combining-matching network 350, the downlink frequency port of the duplexer 330 is connected with the input ends of the downlink amplifying links 331, 332, and the uplink frequency port of the duplexer 330 is connected with the output ends of the uplink amplifying links 334, 333. Downlink amplifying links 331, 332 of the duplexer 330 and uplink amplifying links 334, 333 of the duplexer 320 include multiple stages of low noise amplifiers, filters, attenuators, detectors, power amplifiers, and other circuits the like. The multi-frequency antenna 303 includes an other duplexer 340 of an other one frequency band of the multiple frequency bands. The duplexer 340 includes a common port, a downlink frequency port, and an uplink frequency port. The common port of the duplexer 340 is connected with the combining-matching network 350, the downlink frequency port of the duplexer 340 is connected with input ends of the downlink amplifying links 341, 342, and the uplink frequency port of the duplexer 340 is connected with output ends of the uplink amplifying links 344, 343. Downlink amplifying links 341, 342 of the duplexer 340 and uplink amplifying links 344, 343 of the duplexer 320 include multiple stages of low noise amplifiers, filters, attenuators, detectors, power amplifiers, and other circuits the like. The uplink and downlink of common ends of the duplexers 330 and 340 and other duplexers that may be combined into one way are combined to the combining-matching network 350 through the combining-matching network 350, and are connected with the multi-frequency antenna 303.

The output ends of the downlink amplifying links of the first frequency band and the input ends of the uplink amplifying links of the first frequency band, the output ends of the downlink amplifying links of the second frequency band and the input ends of the uplink amplifying links of the second frequency band, and the output ends of the downlink amplifying links of other frequency band and the input ends of the uplink amplifying links of the other frequency band are connect with the low-frequency multiplex combining-splitting network 364 separately to be combined together, and then connected with an low-frequency end of the high and low frequency combiner 363. A high-frequency end of the high and low frequency combiner 363 is connected with a common end of the high-frequency multiplex combining-splitting network 365 after combining. The high and low frequency combiner 363 is configured to connect all the uplink input and downlink input of all the frequency bands to the common end 364, and then passes through the DC power separation network 380, and finally connect with the feeder 305 and the indoor antenna 307 through the RF coaxial cable 309.

The function of the power separation network 380 is to separate a DC power supply voltage between the shielding layer and core wires of the RF coaxial cable from the uplink RF signals and downlink RF signals of the RF coaxial cable. And the DC power supply voltage is supplied to the power supply unit 381 of the outdoor device, and then supplied to each active circuit after the voltage is stable. At the same time, the bidirectional RF signals are transmitted between the RF coaxial cable 309 and the high and low frequency combiner 363 with as little loss as possible.

A working principle of the feeder 305 is same as a working principle of the power separation network 380. The feeder 305 is configured to feed the DC power output from an AC/DC power adapter 306 into the RF coaxial cable 309 to supply the outdoor device, which has minimal attenuation of the RF signals between the RF coaxial cable 309 and the indoor antenna 307.

In the embodiment, if it is known that some frequency bands (the number of the some frequency bands is at least 2) of the base station signal around the user are from the same direction, the uplink amplifying links and downlink amplifying links of these frequency bands are combined into one outdoor multi-frequency antenna 303. And the outdoor multi-frequency antenna 303 is a high gain directional antenna aligned with the direction of the base station to which these frequency bands belong, which can significantly improve the communication distance and communication quality. The direction of each antenna is bale to be different. Comparing with the integrated antenna that only be in one direction: the multiple antennas aligns with directions of their corresponding frequency band orientation to better receive the signal.

When the number of frequency bands is large and the installation conditions cannot satisfy that one antenna corresponds to one frequency band, some frequency bands with similar frequencies (the number of the some frequency bands is at least 2) are combined to reduce the number of antennas and facilitate installation. Because the frequency bands are similar in frequency, the bandwidth of each antenna is smaller than the bandwidth of the full-frequency band antenna, which reduces the difficulty of antenna design, and the indexes of the antenna performance are better.

When the number of frequency bands is large, the installation conditions cannot satisfy that one antenna corresponds to one frequency band, and some frequency bands may be selected to be combined according to the principle of minimum combined loss when combining frequency bands. For example, Band12 and Band13 with similar frequency, the downlink frequency of the Band12 and Band13 range from 728 MHz-746 MHz and 746 MHz-757 MHz respectively. In general, the downlink frequency bands of these two frequency bands are amplified as one frequency band, so Band 12 and Band 13 use a same antenna. However, if the base station of one of the frequency bands used by the user is far away from the user, the signal of the one of the frequency bands is very weak, and the base station of another frequency band that the user does not need is near the user, and the signal of the another frequency band is strong. If the two frequency bands are amplified by a same amplifying link, when amplified, the useless strong signal of the another frequency band makes the ALC circuit of the amplifying link to reduce the gain of the amplifying link to avoid overloading, and the weak signal of the one of the frequency bands required by the user cannot be sufficiently amplified under the reduced gain, which makes the user cannot communicate. In order to solve such a problem, it is necessary to amplify the downlink frequency bands of Band12 and Band13 with different amplifying links, and separate the downlink frequency bands of the Band12 and Band13 without a transition band from the same antenna port. However, the conventional filter divide technology cannot realize low loss and sufficient in-band flatness. Therefore, Band 12 and Band 13 adopt different antennas. The Band 12 and Band 13 use separate antennas respectively, or the Band 12 and Band 13 are combined with other bands except for each other. Since there is enough transition band between the Band 12, the Band 13, and other frequency bands, a low-loss and low-in-band ripple is realized by the conventional filter combining-splitting technology.

Embodiment 3

Figure 3:
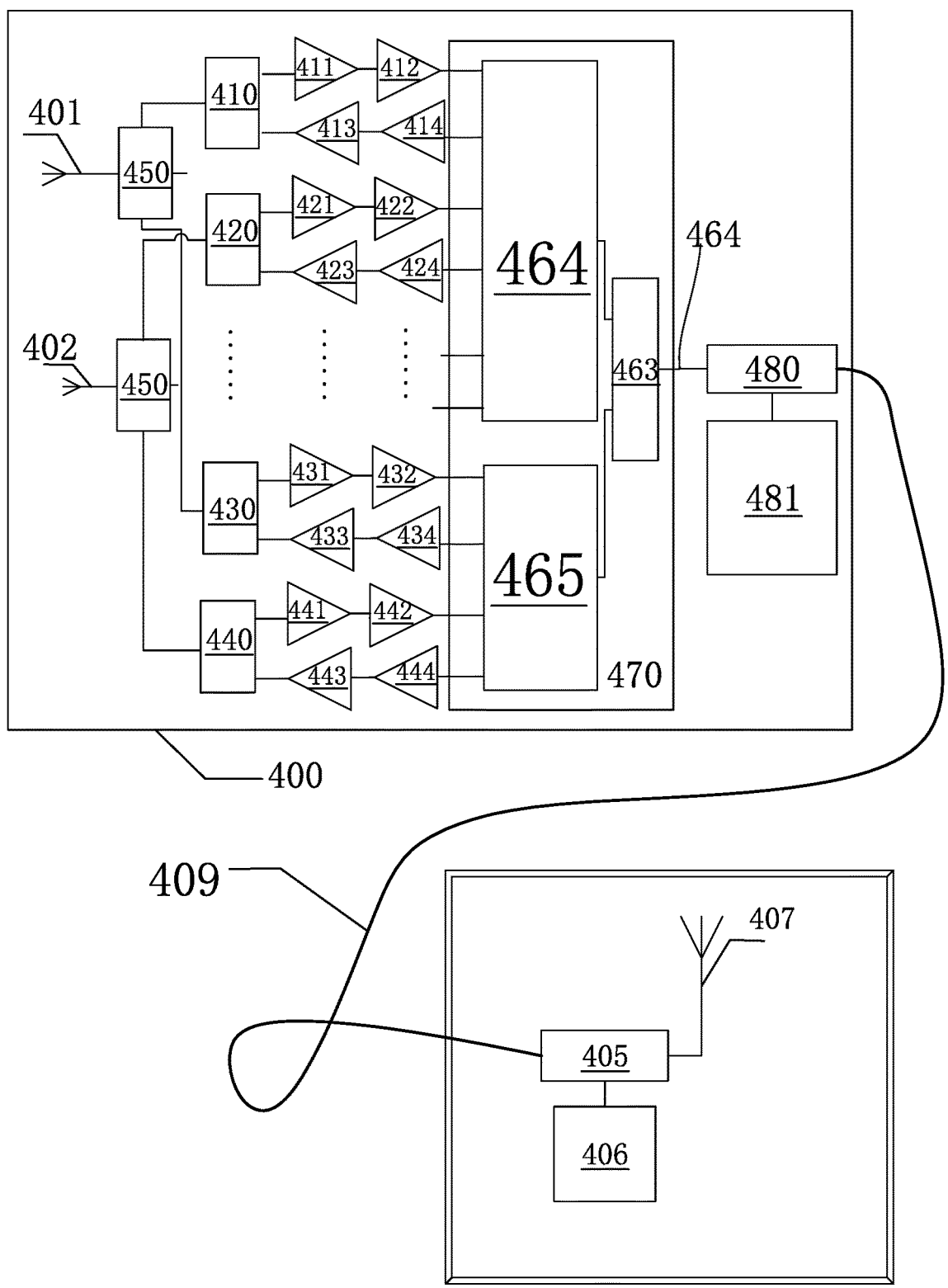
FIG. 3 is a schematic diagram showing a structure of a signal amplifier of a third embodiment of the present disclosure.

As shown in FIG. 3, the present disclosure provides a signal amplifier of a multi-antenna system. The signal amplifier of the multi-antenna system includes:

an outdoor device communicating with base stations; and
an indoor device 400 communicating with a client.

The outdoor device 400 includes a plurality of outdoor antennas, a first bidirectional signal amplifying link and a first combining-splitting network. A first end of the first bidirectional signal amplifying link is coupled to the outdoor antennas. A second end of the first bidirectional signal amplifying link is coupled to the first combining-splitting network. The indoor device includes an indoor antenna 407 and a feeder 405. A first end of the feeder 405 is coupled to the indoor antenna 407. A second end of the feeder is coupled to the first combining-splitting network through an RF coaxial cable 409.

Furthermore, the first bidirectional signal amplifying link includes a plurality of uplink amplifying links and downlink amplifying links. The uplink amplifying links and the downlink amplifying links are configured to process single frequency bands. The first combining-splitting network includes a high-frequency multiplex combining-splitting network, a low-frequency multiplex combining-splitting network and a high and low frequency combiner. First ends of the uplink amplifying links and first ends of the down amplifying links are coupled to the outdoor antennas through a first duplexer. Second ends of the uplink amplifying links and second ends of the downlink amplifying links are coupled to the high-frequency multiplex combining-splitting network or the low-frequency multiplex combining-splitting network. The high-frequency multiplex combining-splitting network and the low-frequency multiplex combining-splitting network are coupled to the indoor device through the high and low frequency combiner.

Furthermore, the outdoor antennas 400 include a plurality of multi-frequency antennas receiving or sending multi-frequency band signals. Output ends of a plurality of the uplink amplifying links processing a single frequency band and input ends of a plurality of the downlink amplifying links are connected with one multi-frequency antenna after combined through matching with a combining network. The one multi-frequency antenna includes the single frequency bands.

Furthermore, the multi-frequency band signals received or sent by the multi-frequency antennas are matched with frequency band signals of the base stations. The frequency band signals of the base stations are in a same direction of the multi-frequency antennas.

Furthermore, the multi-frequency band signals received or sent by the multi-frequency antennas are matched with frequency band signals with minimum loss of the combining network after combining.

In the embodiment, the configuration of the outdoor antennas are reasonably optimized by determining the direction of the base station and combining the frequency bands with the minimum loss of the combining network, which greatly simplify the multiplex combining-splitting network of the end of the outdoor antennas. The complex multi-port multiplex combining-splitting network is replaced by the first duplexer which is simple or a multi-port multiplex combining-splitting network with fewer ports, which reduce the insertion loss of the multiplex combining-splitting network. The insertion loss of the multiplex combining-splitting network is reduced from 4-10 dB to 1-3 dB, and the insertion loss of the long cable is cut out, thus, the signal amplifier is improved by 5-12 dB. Further, the improvement of an in-band flatness of the signal amplifier is also considerable.

Furthermore, the outdoor device 400 includes a power supply unit and a power separation network. The indoor device includes a direct current power source. The feeder 405 is connected with the power separation network through the RF coaxial cable. A positive pole and a negative pole of the direct current power source are fed into core wires and a shielding layer of the RF coaxial cable respectively through the feeder. And the positive pole and the negative pole of the direct current power source pass through the RF coaxial cable and are processed by the power separation network to supply to the power supply unit.

The bidirectional signal amplifying links of the signal amplifier are all disposed in the outdoor device, and a long RF coaxial cable is still needed to connect the indoor antenna or a remaining part of the amplifying links of the room. The loss of the RF coaxial cable does not affect a downlink noise figure and an uplink output power. Although it affects an uplink noise figure and a downlink output power, however, the user using the mobile device are very close to the indoor antenna generally, in a range of several tens of meters, the increased uplink noise figure and the attenuated downlink signal do not affect the user's use. Further, the RF coaxial cable that transmits the signals is configured to power the power supply unit of the outdoor device, thereby eliminating a need for a power wire for the power supply unit, making installation of the signal amplifier easier and more aesthetically pleasing. Further, without affecting specifications of a system performance, the long cable connecting the indoor device and the outdoor device is able to be a thinner cable, which is beautiful and easy to install, and further reduces the cost.

Furthermore, the outdoor antennas include omnidirectional antennas and/or directional antennas. An original full-frequency band broadband antenna is replaced by narrow-band antennas corresponding to each frequency band, which reduces the design difficulty of the antenna. Since the signal amplifier is only for a relatively narrow frequency band, the specifications of the antennas are easier to implement and are more excellent than the full-frequency band antenna.

Furthermore, the outdoor device includes a shell. The plurality of the outdoor antennas are disposed in the shell. A distance between any two of the outdoor antennas is greater than 50 mm. A sufficient distance between the outdoor antennas is needed to reduce a mutual coupling between the outdoor antennas, thereby ensuring a transmission of the bidirectional signals with a lower loss.

To be specific, the bidirectional signal amplifying links of the signal amplifiers are all disposed in the outdoor device. In order to further reduce the number of outdoor antennas, each outdoor antenna has multiple frequency bands (the number of the frequency bands is at least 2), and the frequency bands are able to be combined in any combination. A basic principle is the frequency bands with a same direction of the base station are combined into one multi-frequency antenna; and the frequency bands cannot determine the direction of the base stations and with the minimum loss of the combined network are combined to form a multi-frequency antenna. The embodiment is applicable to outdoor installation conditions where only a small number of antennas (2-3) are installed.

Embodiment 4

Figure 4:
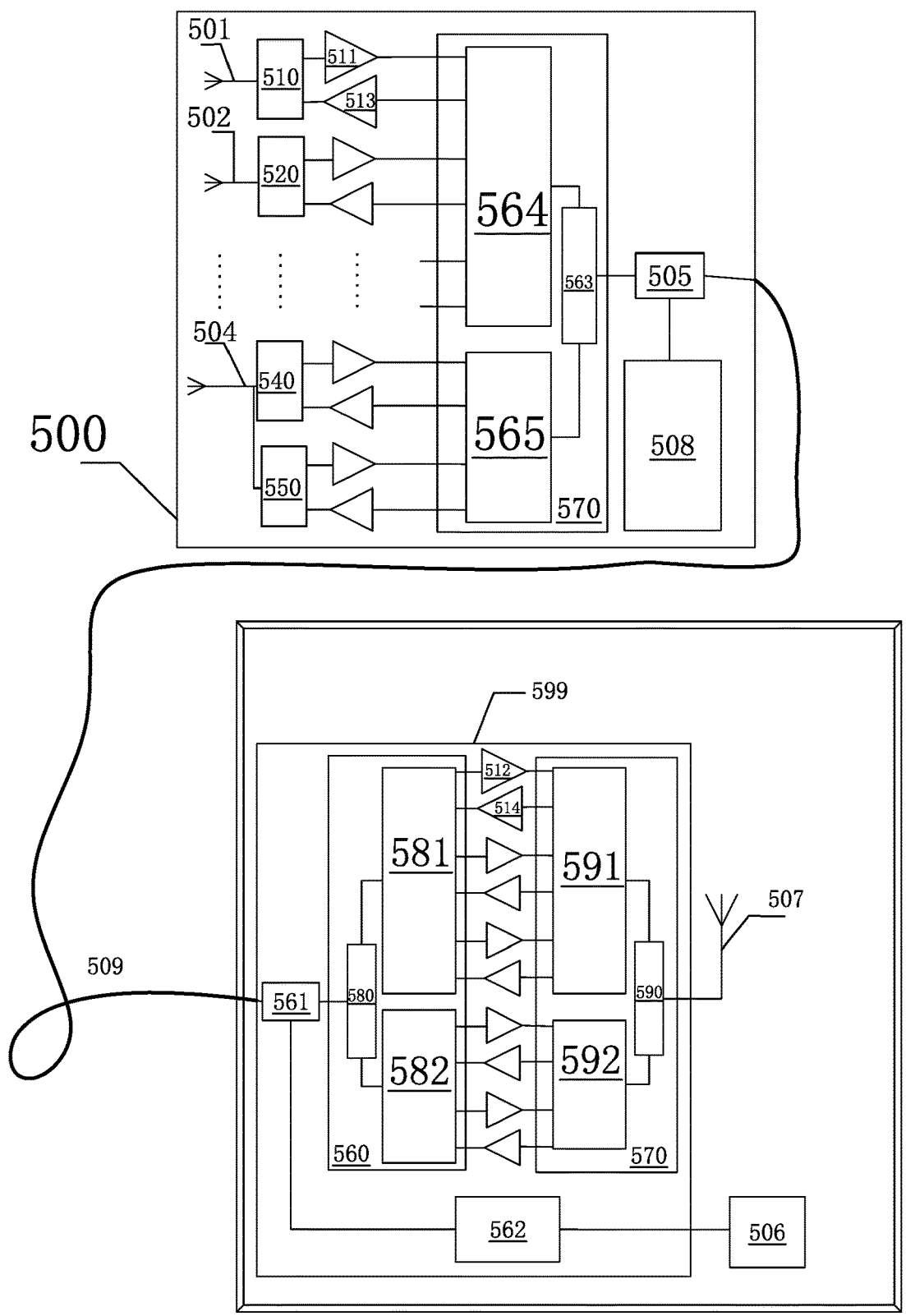
FIG. 4 is a schematic diagram showing a structure of a signal amplifier of a fourth embodiment of the present disclosure.

As shown in FIG. 4, the present disclosure provides a signal amplifier of a multi-antenna system. The signal amplifier of the multi-antenna system includes:

an outdoor device 500 communicating with a base station, and an indoor device communicating with a client.

The outdoor device 500 includes a plurality of outdoor antennas, a first bidirectional signal amplifying link and a first combining-splitting network. A first end of the first bidirectional signal amplifying link is coupled to the outdoor antennas. a second end of the first bidirectional signal amplifying link is coupled to the first combining-splitting network. The indoor device includes an indoor antenna 507 and a feeder 561. A first end of the feeder 561 is coupled to the indoor antenna 507. A second end of the feeder 561 is coupled to the first combining-splitting network through an RF coaxial cable 509.

Furthermore, the first bidirectional signal amplifying link includes a plurality of uplink amplifying links and downlink amplifying links. The uplink amplifying links and the downlink amplifying links are configured to process single frequency bands. The first combining-splitting network includes a high-frequency multiplex combining-splitting network, a low-frequency multiplex combining-splitting network and a high and low frequency combiner. First ends of the uplink amplifying links and first ends of the down amplifying links are coupled to the outdoor antennas through a first duplexer. Second ends of the uplink amplifying links and second ends of the downlink amplifying links are coupled to the high-frequency multiplex combining-splitting network or the low-frequency multiplex combining-splitting network. The high-frequency multiplex combining-splitting network and the low-frequency multiplex combining-splitting network are coupled to the indoor device through the high and low frequency combiner.

In the embodiment, the configuration of the outdoor antennas are reasonably optimized by determining the direction of the base station and combining the frequency bands with the minimum loss of the combining network, which greatly simplify the multiplex combining-splitting network of the end of the outdoor antennas. The complex multi-port multiplex combining-splitting network is replaced by the first duplexer which is simple or a multi-port multiplex combining-splitting network with fewer ports, which reduce the insertion loss of the multiplex combining-splitting network. The insertion loss of the multiplex combining-splitting network is reduced from 4-10 dB to 1-3 dB, and the insertion loss of the long cable is cut out, thus, the signal amplifier is improved by 5-12 dB. Further, the improvement of an in-band flatness of the signal amplifier is also considerable.

Furthermore, the outdoor antennas include a plurality of single-frequency antennas receiving or sending single-frequency band signals. An output end of each uplink amplifying link of single frequency band and an input end of each downlink amplifying link of single frequency band are connected with one single-frequency antenna corresponding to the single frequency band after combined by the first duplexer.

Furthermore, the indoor device includes a second combining-splitting network and a second bidirectional signal amplifying link. Two ends of the second combining-splitting network are coupled to the feeder 561 and the second bidirectional signal amplifying link respectively.

Furthermore, the outdoor device 500 includes a power supply unit and a power separation network. The indoor device includes a direct current power source. The feeder 561 is connected with the power separation network through the RF coaxial cable. A positive pole and a negative pole of the direct current power source are fed into core wires and a shielding layer of the RF coaxial cable respectively through the feeder 561. And the positive pole and the negative pole of the direct current power source pass through the RF coaxial cable and are processed by the power separation network to supply to the power supply unit.

The amplifying links connected with the outdoor antennas are only a part of the amplifying links, and an other part the amplifying links are disposed in the room. The RF coaxial cable is located in a middle of the amplifying links, so only a few dB gain is added to compensate the attenuation of the RF coaxial cable. There is no effect on the bidirectional noise figure and the output power.

The RF coaxial cable adopts a lower cost thin cable, which is beautiful and easy to install. Moreover, the RF coaxial cable that transmits the signal is configured to power the power supply unit, thereby eliminating a need for a power wire for the power supply unit, making an installation of the signal amplifier easier and more aesthetically pleasing. Further, the long cable connecting the indoor device and the outdoor device is able to be a thinner cable, which is beautiful and easy to install, and further reduces the cost.

Furthermore, the outdoor antennas include omnidirectional antennas and/or directional antennas. An original full-frequency band broadband antenna is replaced by narrow-band antennas corresponding to each frequency band, which reduces the design difficulty of the antenna. Since the signal amplifier is only for a relatively narrow frequency band, the specifications of the antennas are easier to implement and are more excellent than the full-frequency band antenna.

Furthermore, the outdoor device 500 includes a shell. The plurality of the outdoor antennas are disposed in the shell. A distance between any two of the outdoor antennas is greater than 50 mm. A sufficient distance between the outdoor antennas is needed to reduce a mutual coupling between the outdoor antennas, thereby ensuring a transmission of the bidirectional signals with a lower loss.

To be specific, part of the bidirectional signal amplifying links of the signal amplifiers are disposed in the outdoor device 500, and are installed with the outdoor antennas. Other part of the bidirectional signal amplifying links 599 of the signal amplifiers are disposed in the indoor device, and are connected with the part of the bidirectional signal amplifying links through the RF coaxial cable 509. In order to transmit multiple uplink signals ad down link signals through the RF coaxial cable 509, it is necessary to add two multi-port combining-splitting networks 560 and 570 at both ends of the RF coaxial cable 509.

The uplink and downlink amplification links 513 and 511 disposed in the outdoor device include an uplink final stage power amplifier and a downlink low noise amplifier, and the uplink amplification link 514 disposed in the indoor device includes circuits such as an uplink low noise amplifier, a gain module, a filter, an attenuator, a detector and other circuits. The downlink amplifying link 512 of the indoor device includes circuits such as a gain block, a filter, an attenuator, a final stage power amplifier, a detector, and other circuits. An output end of an indoor downlink amplifying link 512 and an input end of an indoor uplink amplifying link and output ends of other indoor downlink amplifying links and input ends of other indoor uplink amplifying links of the low frequency bands are combined in the low-frequency multiplex combining-splitting network 591, and then sent to a low frequency end of the high and low frequency combiner 590. A high frequency end of the high and low frequency combiner 590 is connected with a common end of the high frequency multiplex combining-splitting network 592. The common end of the high and low frequency combiner 590 is connected with the indoor antenna 507.

The indoor AC\DC power adapter 506 supplies power to the power supply unit 562 of an active portion of the indoor device, and the feeder 561 feeds the power to the RF coaxial cable 509 to provide power for an active circuit of the outdoor device. The power separation network 505 of the outdoor device separates the DC power supply from an RF channel and sends it to the outdoor power module 508 to provide power to the outdoor active circuit.

The above content is a further detailed description of the present disclosure in conjunction with the specific preferred embodiments, and the specific implementation of the present disclosure is not limited to the description. It will be apparent to those skilled in the art that a number of simple deductions or substitutions may be made without departing from the conception of the present disclosure, which should be considered as being within the scope of the present disclosure.

What is claimed is:

1. A signal amplifier of a multi-antenna system, comprising:
an outdoor device communicating with base stations; and
an indoor device communicating with a client;
wherein the outdoor device comprises a plurality of outdoor antennas, a first bidirectional signal amplifying link and a first combining-splitting network; a first end of the first bidirectional signal amplifying link is coupled to the outdoor antennas; a second end of the first bidirectional signal amplifying link is coupled to the first combining-splitting network; the indoor device comprises an indoor antenna and a feeder; a first end of the feeder is coupled to the indoor antenna, a second end of the feeder is coupled to the first combining-splitting network through a RF (RF) coaxial cable;
wherein the outdoor antennas comprise omnidirectional antennas and/or directional antennas;
wherein the feeder is configured to feed direct current (DC) power output from an alternating current/direct current (AC/DC) power adapter into the RF coaxial cable to supply power to the outdoor device.

2. The signal amplifier of the multi-antenna system according to claim 1, wherein the first bidirectional signal amplifying link comprises a plurality of uplink amplifying links and downlink amplifying links, the uplink amplifying links and the downlink amplifying links are configured to process single frequency bands; the first combining-splitting network comprises a high-frequency multiplex combining-splitting network, a low-frequency multiplex combining-splitting network and a high and low frequency combiner; first ends of the uplink amplifying links and first ends of the down amplifying links are coupled to the outdoor antennas through a first duplexer; second ends of the uplink amplifying links and second ends of the downlink amplifying links are coupled to the high-frequency multiplex combining-splitting network or the low-frequency multiplex combining-splitting network; the high-frequency multiplex combining-splitting network and the low-frequency multiplex combining-splitting network are coupled to the indoor device through the high and low frequency combiner.

3. The signal amplifier of the multi-antenna system according to claim 2, wherein the outdoor antennas comprise a plurality of single-frequency antennas receiving or sending single-frequency band signals, an output end of each uplink amplifying link of single frequency band and an input end of each downlink amplifying link of single frequency band are connected with one single-frequency antenna corresponding to the single frequency band after combined by the first duplexer.

4. The signal amplifier of the multi-antenna system according to claim 2, wherein the outdoor antennas comprise a plurality of multi-frequency antennas receiving or sending multi-frequency band signals; output ends of a plurality of the uplink amplifying links processing one single frequency band and input ends of a plurality of the downlink amplifying links are connected with one multi-frequency antenna after combined through matching with a combining network; wherein the one multi-frequency antenna comprises the single frequency bands.

5. The signal amplifier of the multi-antenna system according to claim 4, wherein the multi-frequency band signals received or sent by the multi-frequency antennas are matched with frequency band signals of the base stations; the frequency band signals of the base stations are in a same direction of the multi-frequency antennas.

6. The signal amplifier of the multi-antenna system according to claim 4, wherein the multi-frequency band signals received or sent by the multi-frequency antennas are matched with frequency band signals with a minimum loss of the combining network after combining.

7. The signal amplifier of the multi-antenna system according to claim 1, wherein the indoor device comprises a second combining-splitting network and a second bidirectional signal amplifying link; two ends of the second combining-splitting network are coupled to the feeder and the second bidirectional signal amplifying link respectively.

8. The signal amplifier of the multi-antenna system according to claim 1, wherein the outdoor device comprises a power supply unit and a power separation network; the indoor device comprises a direct current power source; the feeder is connected with the power separation network through the RF coaxial cable; a positive pole and a negative pole of the direct current power source are fed into core wires and a shielding layer of the RF coaxial cable respectively through the feeder; and the positive pole and the negative pole of the direct current power source pass through the RF coaxial cable and are processed by the power separation network to supply to the power supply unit.

9. The signal amplifier of the multi-antenna system according to claim 1, wherein the outdoor device comprises a shell; the plurality of the outdoor antennas are disposed in the shell; a distance between any two of the outdoor antennas is greater than 50 mm.

\* \* \* \* \*